United States Patent [19]

Golubev et al.

[11] 3,948,692
[45] Apr. 6, 1976

[54] METHOD OF PREPARING MULTI-LAYER SEMICONDUCTOR HETERO-STRUCTURES ON THE BASIS OF COMPOUNDS $A^{III}B^V$ WHERE $A^{III}$ IS A METAL OF GROUP THREE AND $B^V$ IS A NON-METAL OF GROUP FIVE

[76] Inventors: Lev Vasilievich Golubev, ulitsa Karpinskogo, 21, kv. 33, Leningrad; Evgeny Fedorovich Korneev, prospekt 50 letiya Oktyabrya, 54, kv. 13, Chernovitsy; Jury Vasilievich Shmartsev, prospekt M. Toreza, 9, kv. 1, Leningrad, all of U.S.S.R.

[22] Filed: June 24, 1974

[21] Appl. No.: 482,595

[52] U.S. Cl. .............. 148/171; 148/172; 148/173; 252/62.3 GA; 204/39; 204/61; 156/602
[51] Int. Cl.² ............................................. H01L 7/38
[58] Field of Search ............ 148/171, 172, 173, 1.6; 252/62.3 GA; 117/201; 204/39, 61

[56] References Cited
UNITED STATES PATENTS

| | | | |
|---|---|---|---|
| 2,999,776 | 9/1961 | Dorendorf et al. | 148/1.6 |
| 3,411,946 | 11/1968 | Tramposch | 117/201 |

OTHER PUBLICATIONS

J. of the Electrochemical Society, Vol. 120, No. 4, Apr. 1973, pp. 583 and 584.

*Primary Examiner*—G. Ozaki
*Attorney, Agent, or Firm*—Haseltine, Lake & Waters

[57] ABSTRACT

The method of preparing multi-layer semiconductor heterostructures on the basis of compounds $A^{III}B^V$, where $A^{III}$ is an element of the third group and $B^V$ is an element of the fifth group, consists in crystallization of layers of this heterostructure on a substrate from a liquid zone which is gallium or bismuth pre-saturated with compounds $A^{III}B^V$ from a source which is a solid solution of compounds $A^{III}B^V$ feeding the liquid zone with the material of the crystallizing layers.

4 Claims, No Drawings

METHOD OF PREPARING MULTI-LAYER SEMICONDUCTOR HETERO-STRUCTURES ON THE BASIS OF COMPOUNDS $A^{III}B^{V}$ WHERE $A^{III}$ IS A METAL OF GROUP THREE AND $B^{V}$ IS A NON-METAL OF GROUP FIVE

The invention relates to methods of preparing semiconductor structures consisting of several layers of semiconductor material having different chemical compositions, and more particularly it relates to a method of preparing multi-layer semiconductor heterostructures on the basis of compounds $A^{III}B^{V}$, where $A^{III}$ is an element of the third group and $B^{V}$ is an element of the fifth group of the Periodic System.

A method is known in the prior art for preparing multi-layer semiconductor heterostructures on the basis of compounds $A^{III}B^{V}$, where $A^{III}$ is an element of the third group and $B^{V}$ is an element of the fifth group of the Periodic System consisting in crystallization of layers of this heterostructure on a substrate made of a material which is any of the $A^{III}B^{V}$ compounds to form this heterostructure, effected from a liquid zone in the form of gallium or bismuth pre-saturated with comounds $A^{III}B^{V}$ used to form this heterostructure. The liquid zone is saturated from a source, feeding the liquid zone with the material of the crystallizing layers and consisting of compounds $A^{III}B^{V}$, which, according to the known method are the compounds Ga and AlAs.

Moreover, the source has a variable composition in the plane parallel to the substrate, and consists of one AlAs plate and one GaAs plate, while the composition cyrstallizing on the substrate layers is controlled by rotating the source over the substrate. The liquid zone during the entire process of crystallization is located inbetween the source and the substrate, while the process of crystallization proper takes place under the action of variable temperature. The temperature is varied by virtue of a special thermal device.

The disadvantage of the known method of preparing multi-layer semiconductor heterostructures on the basis of compounds $A^{III}B^{V}$ resides in that the crystallizing layers of the heterostructures are almost similar to one another with respect to their chemical composition, since due to rotation of the source over the substrate, the compositions of the saturated sections of the liquid zone that are under different plates of the source are equalized, and hence the composition of heterostructure layers, which are crystallized from each of these sections of the liquid zone, is equalized too.

Another disadvantage of the known method lies with the impossibility of obtaining layers of uniform thickness, which is due to the use of outer thermal devices producing a symmetrical thermal field, which in turn, is responsible for unequal conditions for layer growth on various sections of the substrate.

Another disadvantage of the known method is the high inertia of the process for preparing multi-layer semiconductor heterostructures, which is also due to the use of outer thermal devices producing the required differential temperature.

The object of the invention is to provide a method of preparing multi-layer semiconductor heterostructures on the basis of compounds $A^{III}B^{V}$ which would ensure preparation of heterostructure layers differing in their chemical composition.

Another object of the invention is to provide a method of preparing multi-layer semiconductor heterostructures on the basis of compounds $A^{III}B^{V}$ which would ensure the preparation of heterostructure layers of uniform thickness.

Still another object of the invention consists in providing an inertia-free method of preparing multi-layer semiconductor heterostructures on the basis of compounds $A^{III}B^{V}$.

The essence of the invention consists in that the method of preparing multi-layer semiconductor heterostructures on the basis of compounds $A^{III}B^{V}$, where $A^{III}$ is an element from the third group and the $B^{V}$ is an element of the fifth group of the Periodic System, is effected by crystallization of layers of this heterostructure on a substrate, made of a material which is any of the compounds $A^{III}B^{V}$ used for the formation of this heterostructure, from a liquid zone which is gallium or bismuth pre-saturated with compounds $A^{III}B^{V}$ used to form this heterostructure. The liquid zone is saturated from a source feeding the liquid zone with the material of the crystallizing layers and consisting of compounds $A^{III}B^{V}$, and, according to the invention, for crystallization of the layers of the multi-layer semiconductor heterostructure on the basis of compounds GaSb and AlSb, selected as a source is a solid solution GaSb-AlSb, and the process of crystallization is effected by the action of direct current pulses passed through the source, liquid zone and substrate in the direction that ensures crystallization of the layers on the substrate by dissolution of the material of the source in the liquid zone; as a single pulse of direct current passes, two layers of the multi-layer semiconductor heterostructure are crystallized.

Other objects and advantages of the invention will become subsequently clear to those skilled in the art from a detailed description of the method of preparing multi-layer semiconductor heterostructures on the basis of compounds $A^{III}B^{V}$.

Let us consider the proposed method of preparing multi-layer semiconductor heterostructures on the basis of compounds GaSb and AlSb.

The source, which is a solid solution GaSb-AlSb, the liquid zone, which is a liquid metal (gallium and bismuth), the substrate made from AlSb or GaSb, the outer source of direct current and the switch, all make a closed electrical circuit. At the initial moment (before the electric pulse is emitted), the source, the liquid zone and the substrate have an equal temperature T°C which is so selected that it is above the melting point of the liquid zone metal, and moreover, at this temperature the liquid zone is saturated with the source material to the concentrations corresponding to the solubility of GaSb and AlSb in the liquid zone at this temperature T°C. The contact of the liquid zone with the substrate at this initial moment is absent. Further, as the liquid zone becomes saturated with the source material, it is brought into contact with the substrate to form a contact surface; the material of the substrate (GaSb or AlSb) will not be dissolved in the liquid zone since the liquid zone is already saturated with this material. Any further deviation of the temperature from T°C will cause either dissolution of the materials of the source and the substrate in the liquid zone (if the temperature is raised) or crystallization of GaSb and AlSb from the liquid zone (if the temperature is lowered).

At the next moment, making use of the switch and of the direct current source, a direct current pulse is sent through the source, the liquid zone, and the substrate. It is common knowledge that as direct current is passed through the interface of the semiconductor material with its melt (or solution-melt), depending of the direction of the current, heat is either liberated or absorbed at said interface, which phenomenon obeys the Peltier effect. The direction of the direct current pulse is selected so that heat should be evolved at the interface of the source and the liquid zone, and so that heat should be absorbed at the interface of the liquid zone and the substrate.

As an electric pulse passes, and as heat is evolved the layer of the source material is dissolved, and the thickness of the layer depends on the quantity of the heat liberated, and hence on the magnitude and the length of the direct current pulse. At the same time, the temperature is lowered at the interface of the substrate and the liquid zone, and since the liquid zone is oversaturated with respect to GaSb and AlSb, the first layer begins to crystallize out, this layer consisting largely of AlSb because the segregation coefficient in aluminum is much higher than in gallium. As the layer of the liquid zone adjacent with the substrate becomes depleted with respect to AlSb, another layer consisting mostly of GaSb becomes crystallized. Moreover, during the time of the current pulse passage through the source, liquid zone and the substrate, only two layers of the heterostructure, namely the AlSb layer and the GaSb layer, are crystallized out on the substrate. As pulses of direct current are sent again, a semiconductor multi-layer heterostructure on the basis of compounds GaSb and AlSb is obtained.

Let us consider a more detailed example of the embodiment of the method for preparing multi-layer semiconductor heterostructures on the basis of compounds $A^{III}B^{V}$, where $A^{III}$ is a metal of the third group and $B^{V}$ is an element of the fifth group of the Periodic System.

The source, the material of which is a solid solution GaSb - AlSb, and the GaSb substrate, made in the form of cylinders 10 mm in diameter and 100 mm high, having polished ends, are placed into a quartz ampoule provided with special source and substrate-holders. The surface of the source is arranged strictly parallel with the counterfacing substrate surface. On the surface of the source there is placed the required (depending on the required thickness of the liquid zone) quantity of bismuth, and hydrogen is passed through the ampoule under a pressure of 0.5 atm. The ampoule is heated to the temperature of T°C = 400 − 550°C by an external heater.

It is not recommended to heat the ampoule containing the source, bismuth and the substrate, to temperatures below 400°C, since the solubility of GaSb and AlSb in bismuth is small at these temperatures, and the process for preparing multi-layer semiconductor heterostructures will take a long period of time.

At temperatures above 550°C, the adjacent layers of the obtained heterostructure begin to level with respect to their chemical composition due to diffusion, which is not desirable either, particularly if the thickness of said layers is smaller than one micron.

The source, bismuth and the substrate are kept at the temperature T°C for 5 hours, during which time bismuth is molten on the source surface and is saturated with its material (GaSb and AlSb) to the concentration corresponding to the solubilities of these substances in bismuth at said temperature T°C.

The substrate and the source are now brought in contact with the liquid zone to wet the entire surface of the GaSb substrate with molten bismuth saturated with GaSb and AlSb. As soon as the substrate and the liquid bismuth come in contact, a direct current pulse is passed through the source, bismuth and the substrate. The length of the pulse is two hours, at a current density of 1.5–25 A/sq.cm. Another pulse of direct current of the same length and density is passed at a 30-minute interval.

When the process is over, the substrate with the multi-layer semiconductor heterostructure applied thereto, is removed from contact with the liquid bismuth, and the temperature T°C is lowered to room temperature within 2.5 hours.

Crystallized multi-layer semiconductor heterostructures consist of layers that are different with respect to their chemical composition, while the thickness of the layers varies within the range from 10 to 80 microns, depending on the density of the current passed, which is selected within the range from 1.5 to 25 amperes per sq.cm. The action of direct current pulses having the density lower than 1.5 A/sq.cm. takes more time for the crystallization process to occur, while current densities over 25 A/sq.cm. destroy the stable conditions for crystallization of the layers on the substrate due to the thermal effect of the electric current.

In the above example of the embodiment of the proposed method of preparing multi-layer semiconductor heterostructures on the basis of compounds $A^{III}B^{V}$, bismuth is used as the metal in the liquid zone, and the substrate material is GaSb. If AlSb is used as the substrate material, the process of crystallization of layers does not change and the final result of the process is not changed either.

Taking gallium as the liquid-zone material, the temperature T°C should be selected within the range from 450°C to 550°C. The lower temperature limit is raised with gallium (compared with bismuth), which is due to lower solubility of GaSb and AlSb in gallium compared to their solubility in bismuth. Otherwise the process of crystallization of layers in the multi-layer semiconductor heterostructures proceeds under the same conditions and in the same sequence as has been described for the above example.

The proposed method of preparing multi-layer semiconductor heterostructures on the basis of compounds $A^{III}B^{V}$, where $A^{III}$ Is an element of the third group and $B^{V}$ is an element of the fifth group of the Periodic System, makes it possible to obtain heterostructures suitable for making semiconductor devices utilizing the properties of heterojunctions, heterolasers in particular.

The multi-layer semiconductor heterostructures obtained by the proposed method have distinctly bordering layers of uniform thickness and of different chemical compositions.

The regulation of the process of crystallization of these layers with electric current makes it possible to work out an inertia-free method of preparing heterostructures and promotes uniform and quality crystallization of said layers on the substrate.

What we claim is:

1. A method of preparing a multi-layer semiconductor heterostructure on the basis of compounds $A^{III}B^{V}$, where $A^{III}$ is an element of the third group and $B^{V}$ is an element of the fifth group of the Periodic System, consisting in crystallization of layers of the multi-layer semiconductor heterostructure by passing current pulses through the substrate, liquid phase, the liquid-to-solid interface of the phases and said substrate, and a source selected from a compound of the formula $A^{III}B^{V}$ wherein $A^{III}$ and $B^{V}$ are as defined above.

2. A method according to claim 1 wherein the duration of said pulses and spacing between said pulses exceeds the time period for the establishment of the diffusion equilibrium in said system, said system comprising said source, solution-melt and substrate.

3. A method according to claim 1, wherein said solution-melt is an element selected from the group $A^{III}$ or $B^{V}$ pre-saturated with the materals of said source at the temperature at which the process is conducted.

4. A method according to claim 1, wherein said substrate is GaSb or AlSb and said solution-melt is an element selected from the group consisting of Bi and Ga, pre-saturated at a temperature of from 450° to 550°C with said compounds or with AlSb from said source, said source being a solid solution of GaSb-AlSb, and supplying said liquid phase with the compounds GaSb and AlSb under the action of direct current pulses, said current passing through said source, liquid phase and the substrate in a direction which ensures the crystallization of the layers on the substrate by dissolving the materials of the source in the liquid phase, two layers of the multi-layer semiconductor heterostructure being crystallized when one pulse of current is applied.

* * * * *